US011815822B2

United States Patent
Joshi et al.

(10) Patent No.: US 11,815,822 B2
(45) Date of Patent: Nov. 14, 2023

(54) ELECTRODEPOSITION COMPATIBLE ANTI-REFLECTION COATINGS FOR LASER INTERFERENCE LITHOGRAPHY APPLICATIONS

(71) Applicants: Toyota Motor Engineering & Manufacturing North America, Inc., Plano, TX (US); The Board of Trustees of the University of Illinois, Urbana, IL (US)

(72) Inventors: Shailesh N. Joshi, Ann Arbor, MI (US); Gaurav Singhal, Champaign, IL (US); Paul Vannest Braun, Champaign, IL (US); Kai-Wei Lan, Champaign, IL (US); Nenad Miljkovic, Urbana, IL (US)

(73) Assignees: Toyota Motor Engineering & Manufacturing North America, Inc., Plano, TX (US); The Board of Trustees of the University of Illinois, Urbana, IL (US)

( * ) Notice: Subject to any disclaimer, the term of this patent is extended or adjusted under 35 U.S.C. 154(b) by 26 days.

(21) Appl. No.: 17/704,436

(22) Filed: Mar. 25, 2022

(65) Prior Publication Data
US 2023/0314965 A1 Oct. 5, 2023

(51) Int. Cl.
*G03F 7/20* (2006.01)
*G03F 7/00* (2006.01)

(52) U.S. Cl.
CPC ...... *G03F 7/70958* (2013.01); *G03F 7/70316* (2013.01); *G03F 7/70408* (2013.01)

(58) Field of Classification Search
CPC ............. G03F 7/70958; G03F 7/70316; G03F 7/70408
See application file for complete search history.

(56) References Cited

U.S. PATENT DOCUMENTS 8,541,093 B2 9/2013 Kim et al.
8,546,742 B2 10/2013 Wober
(Continued)

FOREIGN PATENT DOCUMENTS

KR 100512141 B1 9/2005
WO WO-2022016123 A1 * 1/2022

OTHER PUBLICATIONS

Enright et al., "Paul Gilmore, Umesh Gandhi, Ryohei Tsuruta and Brian Pinkelman," Journal of Heat Transfer, vol. 135, Sep. 2013, 12 pages.

(Continued)

*Primary Examiner* — Peter B Kim
(74) *Attorney, Agent, or Firm* — Christopher G. Darrow; Darrow Mustafa PC (57) ABSTRACT

A component with a reflective substrate, a photoresist layer disposed on the reflective substrate, and a light diffusing layer sandwiched between the reflective substrate and the photoresist layer is provided. The light diffusing layer includes an outer metal oxide layer with an outer rough surface configured to diffuse laser light during laser interference lithography of the photoresist layer. The outer metal oxide is also configured to be reduced to a conductive metallic layer during electroplating of the substrate. The outer metal oxide layer includes a plurality of elongated light diffusing elements extending in an outward direction from the substrate such that the outer rough surface diffuses at least 90% of laser light during the laser interference lithography of the photoresist layer.

20 Claims, 8 Drawing Sheets

(56) References Cited

U.S. PATENT DOCUMENTS 9,123,825 B2 9/2015 Beyer et al.
9,496,444 B2 11/2016 Jan et al.

OTHER PUBLICATIONS

Seo et al., "Nanopatterning by Laser Interference Lithography: Applications to Optical Devices," Journal of Nanoscience and Nanotechnology, vol. 14, No. 2, Feb. 2014, pp. 1521-1532.

* cited by examiner

ELECTRODEPOSITION COMPATIBLE ANTI-REFLECTION COATINGS FOR LASER INTERFERENCE LITHOGRAPHY APPLICATIONS

TECHNICAL FIELD

The present disclosure relates generally to laser interference lithography, and particularly to laser interference lithography on reflective substrates.

BACKGROUND

Laser interference lithography (LIL) uses interference between two or more coherent light (laser) beams to provide a maskless exposure of desired pattern (within a photoresist layer (also referred to herein simply as "photoresist"). Also, LIL can produce dense (i.e., cross-linked) features within the photoresist over a wide area without a loss of focus of the laser beams, and the removal of the photoresist that is not cross-linked creates a void space pattern that can be filled with a desired material (e.g., a metallic material) to form a porous outer layer on a substrate surface onto which the photoresist has been applied. However, reflection of the laser beams from the substrate surface can result in undesired exposure and undesired cross-linking within the photoresist such that degradation of the desired pattern within the photoresist layer occurs.

One method or technique to reduce undesired exposure within a photoresist layer is the use of transparent (e.g., glass) substrates. However, transparent substrates are typically electrically insulating and not conducive for applications where electroplating to fill void space pattern in the photoresist is desired. Another method or technique to reduce reflection of laser beams from substrate surfaces, particularly surfaces of reflective substrates, is the use of anti-reflective coatings on the substrate surfaces. However, such coatings, commonly referred to as "bottom anti-reflective coatings" (BARCs), are typically electrically insulating and also not conducive for applications where electroplating to fill the void space pattern in the photoresist is desired. In addition, transparent conductive coatings are known, but are cost prohibitive.

The present disclosure addresses issues related to LIL of photoresist layers for applications where subsequent electroplating is desired, and other issues related to LIL.

SUMMARY

This section provides a general summary of the disclosure and is not a comprehensive disclosure of its full scope or all of its features.

In one form of the present disclosure, a component includes a substrate, a photoresist layer disposed on the substrate, and a light diffusing layer sandwiched between the substrate and the photoresist layer. The light diffusing layer includes an outer metal oxide layer with an outer rough surface configured to diffuse light from a laser during laser interference lithography of the photoresist layer. The outer metal oxide layer is also configured to be reduced to a conductive metallic layer during electroplating of the substrate.

In another form of the present disclosure, a component includes a reflective substrate, a photoresist layer disposed on the reflective substrate, and a light diffusing layer sandwiched between the reflective substrate and the photoresist layer. The light diffusing layer includes an outer copper oxide layer with light diffusing elements extending in an outward direction from the reflective substrate. Also, at least one of an average diameter of and an average spacing between the light diffusing elements is less than about 150 nanometers such that the outer copper oxide layer is configured to diffuse light from a laser during laser interference lithography of the photoresist layer.

In still another form of the present disclosure, a method includes coating a substrate with a conductive metallic layer, oxidizing the conductive metallic layer and forming an outer metal oxide layer, and coating the outer metal oxide layer with a photoresist layer. The outer metal oxide layer is configured to diffuse at least 90% of light from a laser during the laser interference lithography of the photoresist layer. The outer metal oxide layer is also configured to be reduced to a conductive metallic layer during electroplating of the substrate.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIGS. 1A-1E show formation of a photoresist pattern on a reflective substrate with.

FIGS. 4A-4F show formation of a photoresist pattern on a reflective substrate with a light diffusing layer according to the teachings of the present disclosure with.

DETAILED DESCRIPTION

The present disclosure provides a component with a reflective substrate, a photoresist layer disposed on the reflective substrate, and a light diffusing layer disposed or sandwiched between the reflective substrate and the photoresist layer. The light diffusing layer has an outer "rough" surface configured to diffuse light from one or more laser beams during laser interference lithography (LIL) of the photoresist layer such that undesired reflection of the laser beam from the outer rough surface is reduced or minimized. The reduced laser beam reflection from the outer rough surface reduces undesired laser beam exposure in the photoresist layer such that a well define three-dimensional (3D) void space pattern in the photoresist on the reflective substrate is provided. The outer rough surface of the light diffusing layer can include a plurality of light diffusing elements extending in an outward direction from the reflective substrate. As used herein, the phrase "reflective substrate" refers to a substrate with a surface that reflects at least 50% of incident light on the surface. In some variations, a reflective surface disclosed herein reflects at least 70% of incident light. As used herein the phrase "outer rough surface" refers to an outer surface of light diffusing layer with light diffusing elements that have an average diameter and/or an average spacing therebetween that is less than a wavelength of light being used, or to be used, for LIL of a photoresist layer disposed on the outer rough surface. Also, the outer rough surface of the light diffusing layer can be metal oxide surface that is configured to be reduced to a base metal of the oxide and be electrically conductive during electroplating of the reflective substrate.

Figure 1A:
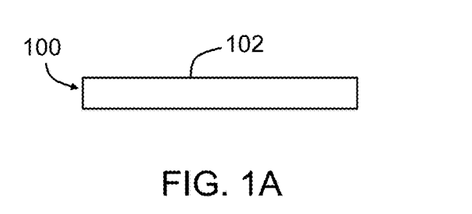
FIG. 1A showing a reflective substrate before being coated with a photoresist layer.
Figure 1B:
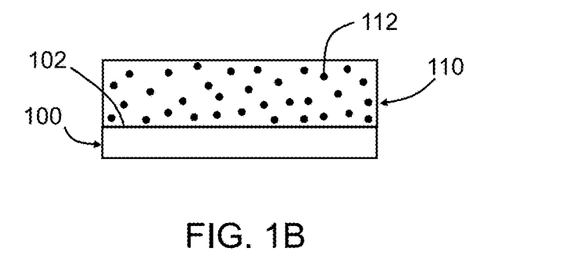
FIG. 1B showing the reflective substrate in FIG. 1A after being coated with a photoresist layer.
Figure 1C:
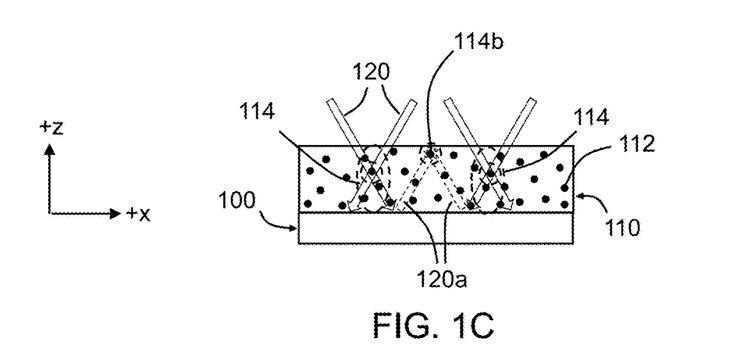
FIG. 1C showing the reflective substrate and the photoresist layer in FIG. 1B during laser interference lithography (LIL) and the inset showing reflection of a laser beam from a surface of the substrate.

Referring to FIGS. 1A-1E, LIL of a photoresist layer on a reflective substrate, and the subsequent void space pattern formed in the photoresist layer, are shown. Particularly, FIG. 1A shows a substrate 100 and FIG. 1B shows a photoresist layer 110, e.g., a negative photo-crosslinking photoresist layer, disposed on an outer (+z direction) surface 102 of the substrate 100 (e.g., a reflective substrate). In some variations, the photoresist layer 110 (also referred to herein simply as "photoresist" or "photoresist 110") includes a photo acid generator (PAG) 112 configured to enhance cross-linking within the photoresist 110 when exposed to a laser beam 120 (FIG. 1C). Non-limiting examples of the photoresist layer 110 include epoxy-based polymers such as SU-8 photoresist and non-limiting examples of PAGs include triphenylsulfonium salts such as triphenylsulfonium triflate, cyclopentadienyl (fluorene) iron(III) hexafluorophosphate, among others.

Figure 1D:
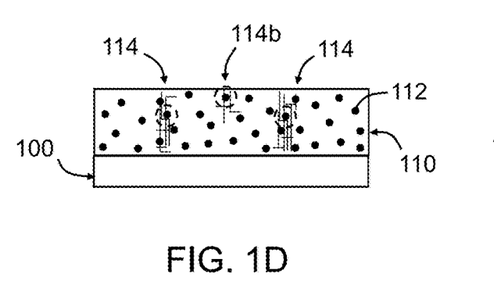
FIG. 1D showing cross-linked areas in the photoresist layer in FIG. 1C after LIL.
Figure 1E:
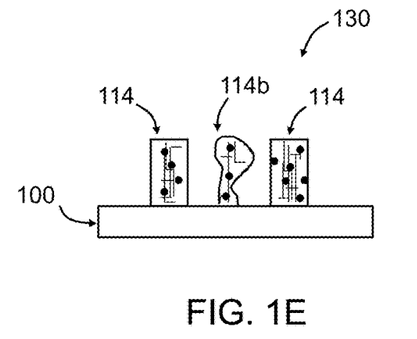
FIG. 1E showing a void space pattern formed in the photoresist layer in FIG. 1D.

FIG. 1C shows two or more laser beams 120 incident on and propagating through the photoresist 110 such that regions 114 are illuminated by or exposed to the interference of two laser beams 120. The interference light of the laser beams 120 initiates cross-linking of the photoresist 110 in the regions 114 as shown in FIG. 1D. In variations where the photoresist 110 includes the PAG 112, exposure of the PAG 112 by the interference between the laser beams 120 enhances cross-linking in the regions 114. In some variations, a post bake of the photoresist 110 after LIL exposure assists or enhances cross-linking of the photoresist 110 in the regions 114. And after desired cross-linking has occurred, the photoresist layer 110 is exposed to a photoresist developer (not shown) such that unexposed regions of the photoresist 110 (without cross-linking) dissolve and are removed such the cross-linked regions 114 remain and form a void space pattern 130 as shown in FIG. 1E. However, and as shown in FIGS. 1C and 1D, reflection 120a of the laser beams 120 from the outer surface 102 of the substrate 100 causes undesired cross-linking in the region 114b, which in turn results in undesired photoresist 110 remaining on the substrate 100 and deterioration or degradation of the void space pattern 130 as illustrated by region 114b in FIG. 1E.

Figure 2:
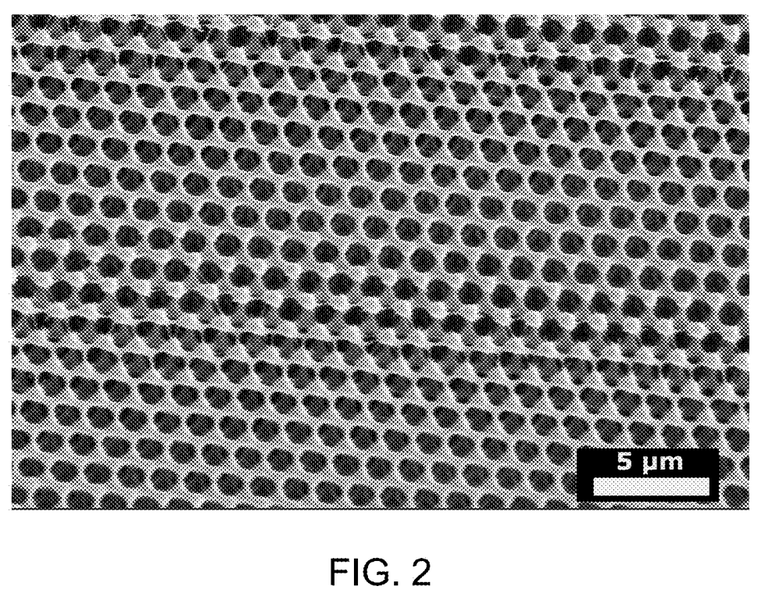
FIG. 2 is a scanning electron microscopy (SEM) image of a void space pattern in a photoresist layer on a transparent substrate.
Figure 3:
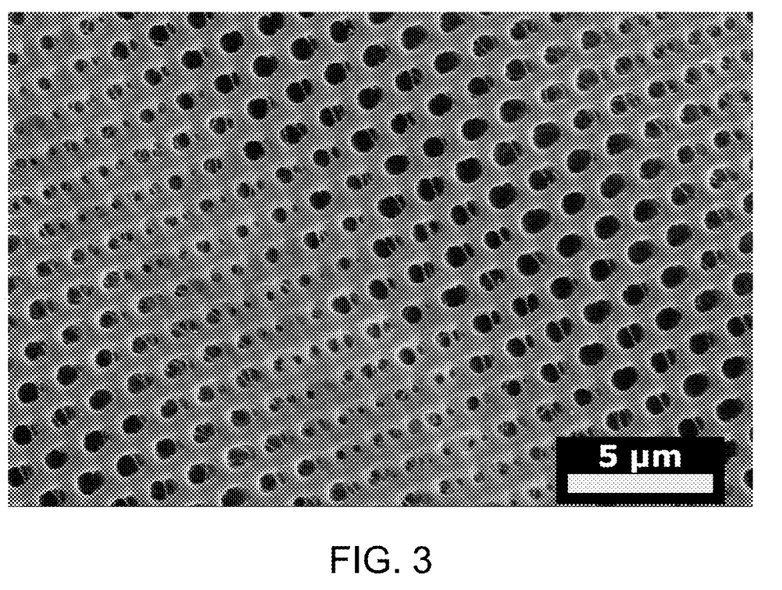
FIG. 3 is a scanning electron microscopy (SEM) image of a resulting 3D pattern formed in a photoresist layer on a reflective substrate.

An actual example of such a deteriorated pattern is observed by comparing FIG. 2 to FIG. 3. Particularly, FIG. 2 is an SEM image of a void space pattern formed by exposing a photoresist layer on a transparent substrate to a given LIL pattern and FIG. 3 is an SEM image of a void space pattern formed by exposing a similar or identical photoresist layer on a gold coated silicon substrate (wafer) to the same LIL pattern. The transparent substrate exhibited essentially no reflection of the LIL laser beams, however the silicon substrate exhibited about 70% of the LIL laser beams. And as observed from FIG. 2, the void space pattern formed in the photoresist layer on the transparent substrate has channels or openings (referred to herein simply as "openings") with a generally uniform size and a periodic spacing therebetween. In contrast, the void space pattern formed in the photoresist layer on the silicon substrate is incomplete, i.e., has areas or regions without any openings, and the openings have different sizes (diameters).

Figure 4A:
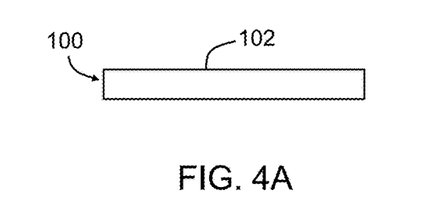
FIG. 4A showing a reflective substrate before being coated with a photoresist layer.
Figure 4B:
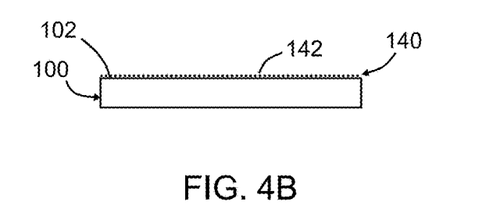
FIG. 4B showing the substrate in FIG. 4A after being coated with a light diffusing layer according to the teachings of the present disclosure.
Figure 4C:
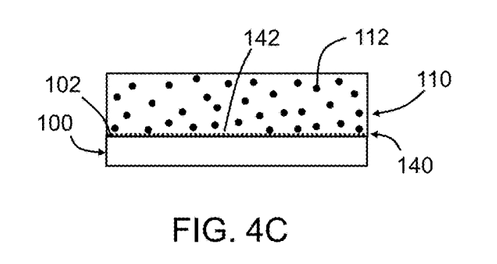
FIG. 4C showing the substrate and light diffusing layer in FIG. 4B after being coated with a photoresist layer according to the teachings of the present disclosure.
Figure 4D:
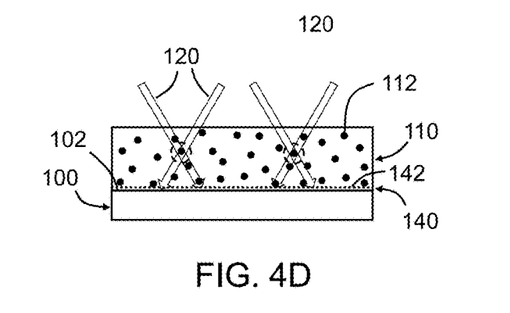
FIG. 4D showing the substrate, the light diffusing layer, and the photoresist layer in FIG. 4C during laser interference lithography (LIL) according to the teachings of the present disclosure.
Figure 4E:
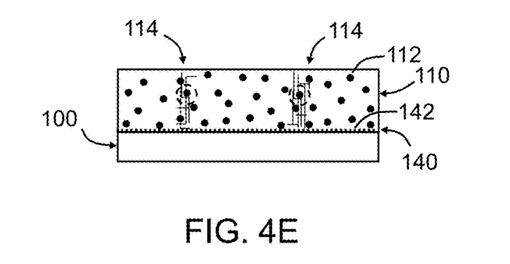
FIG. 4E showing cross-linked areas in the photoresist layer in FIG. 4D after LIL according to the teachings of the present disclosure.
Figure 4F:
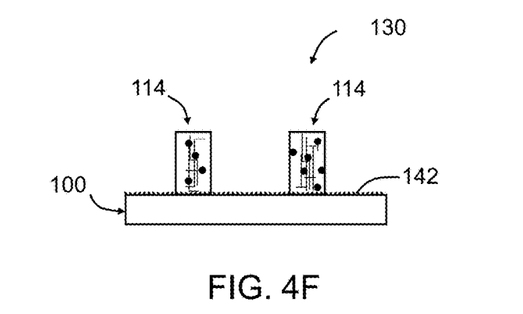
FIG. 4F showing a void space pattern in the photoresist layer in FIG. 4E according to the teachings of the present disclosure.

Referring to FIGS. 4A-4F, steps for a method of forming a void space pattern in a photoresist according to the teachings of the present disclosure are shown. FIG. 4A shows the substrate 100 and FIG. 4B shows a light diffusing layer 140 applied and disposed on the outer surface 102 of the substrate 100. The light diffusing layer has an outer rough surface 142 discussed in greater detail below. FIG. 4C shows the photoresist layer 110, with optional PAG 112, disposed on the outer rough surface 142 of the light diffusing layer 140, and FIG. 4D shows two or more laser beams 120 incident on and propagating through the photoresist 110 such that regions 114 are illuminated by or exposed to the interference of two laser beams 120. The interference light of the laser beams 120 initiates cross-linking of the photoresist 110 in the regions 114 as shown in FIG. 4E. In variations where the photoresist 110 includes the PAG 112, exposure of the PAG 112 by the interference between the laser beams 120 enhances cross-linking in the regions 114. In some variations, a post bake of the photoresist 110 after LIL exposure assists or enhances cross-linking of the photoresist 110 in the regions 114. And after desired cross-linking has occurred, the photoresist layer 110 is exposed to a photoresist developer (not shown) such that unexposed regions of the photoresist 110 (without cross-linking) dissolve and are removed such the cross-linked regions 114 remain and form a void space pattern 130 as shown in FIG. 4F. However, and in contrast to reflection of the laser beams 120 from the outer surface 102 of the substrate 100, the outer rough surface 142 of the light diffusing layer 140 reduces or minimizes reflection of the laser beams 120 and undesired exposure in the photoresist 110 does not occur. Accordingly, a clean or desired void space pattern 130 is provided.

Figure 5:
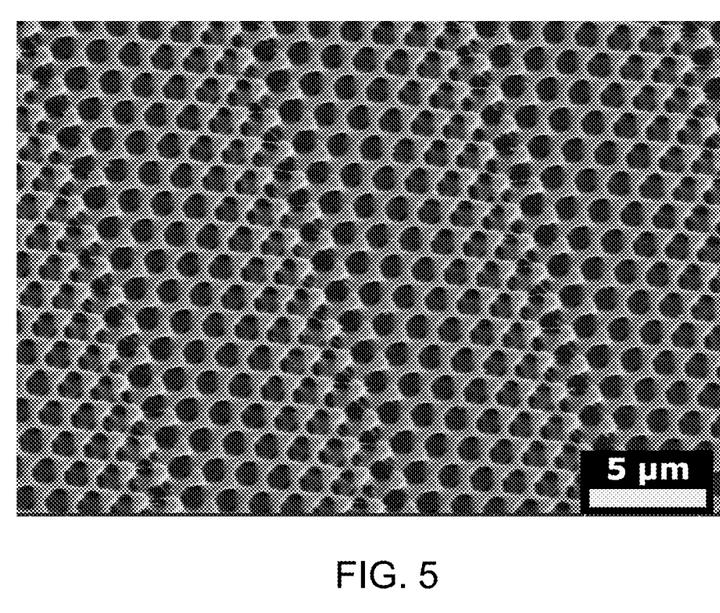
FIG. 5 is an SEM image of a resulting 3D pattern formed in a photoresist layer disposed on a light diffusing layer according to the teachings of the present disclosure.

An example of such a desired void space pattern formed on a silicon substrate using a light diffusing layer according to the teachings of the present disclosure is observed by comparing FIG. 5 to FIG. 2. Particularly, FIG. 5 is an SEM image of a void space pattern formed by exposing a photoresist layer on a silicon substrate using a similar or identical photoresist layer and LIL pattern used to produce the void space pattern shown in FIG. 3, with the exception that a light diffusing layer according to the teachings of the present disclosure was sandwiched between the photoresist and the silicon substrate. And as observed from FIG. 5, the pattern formed in the photoresist is generally the same or identical to the pattern formed in the photoresist layer on the transparent substrate shown in FIG. 2.

Figure 6A:
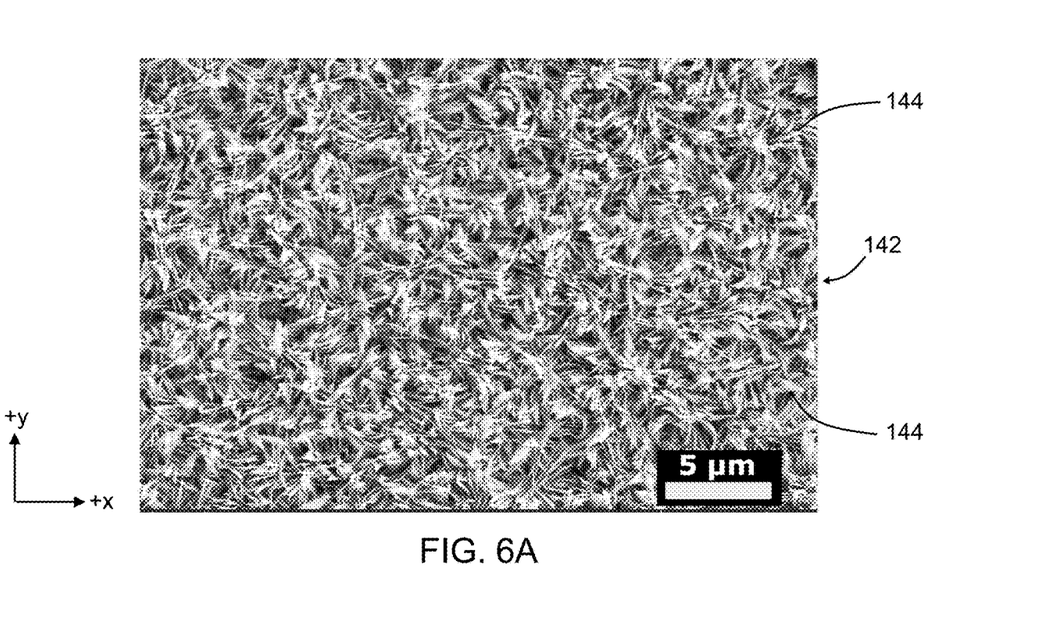
FIG. 6A is an SEM image of an outer surface of a light diffusing layer according to the teachings of the present disclosure.
Figure 6B:
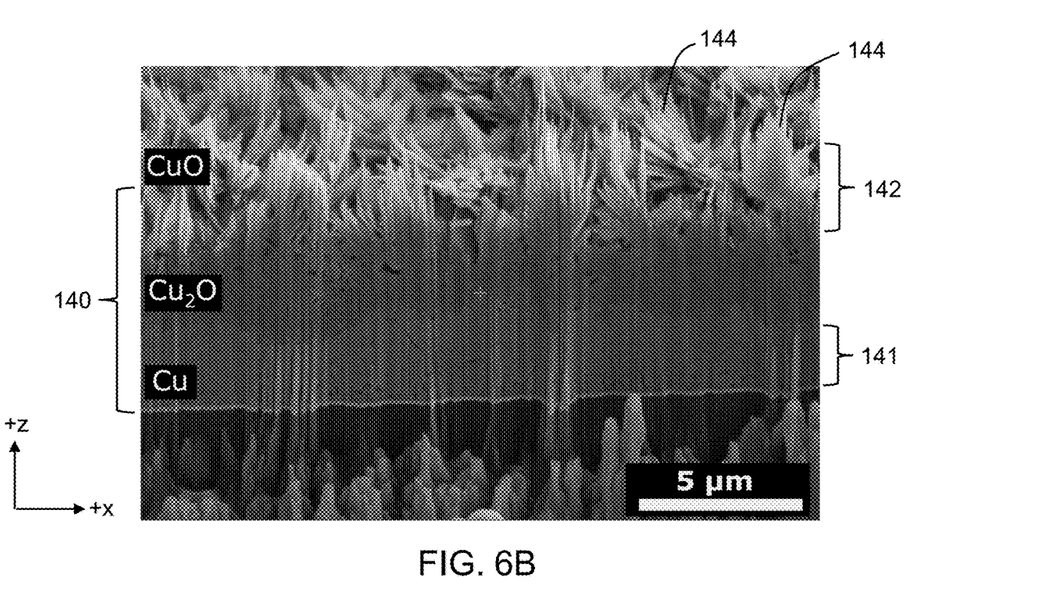
FIG. 6B is an SEM image of a field ion beam (FIB) cross-section of the light diffusing layer in FIG. 6A.

Referring now to FIGS. 6A and 6B, a top view of an outer rough surface 142 of a light diffusing layer 140 formed from copper (Cu) is shown in FIG. 6A and a field ion beam (FIB) cross-section of the Cu light diffusing layer 140 is shown in FIG. 6B. The Cu light diffusing layer 140 includes a Cu inner (−z direction) layer 141 (FIG. 6B) and at least one outer Cu-oxide layer (layers of $Cu_2O$ and CuO shown in FIG. 6B). In addition, the outer Cu-oxide layer has a plurality of elongated light diffusing elements 144 (also referred to herein simply as "light diffusing elements") extending in an outward (+z direction) from the substrate. In some variations, the light diffusing elements 144 are in the form of needles as shown in FIG. 6B, while in other variations the light diffusing elements 144 are in the form of rods (e.g., nanorods). In addition, the light diffusing elements 144 have an average diameter and/or an average spacing that is less than a wavelength of a laser beam used, or to be used, during LIL of a photoresist disposed on the Cu light diffusing layer 140. For example, known LIL light sources have wavelengths such as 532 nm, 364 nm, 355 nm, 244 nm, 213 nm, and 193 nm, among others. Accordingly, an average diameter of and/or average spacing between the light diffusing elements 144 can be less than about 100 nm, less than about 150 nm, less than about 200 nm, less than about 250 nm, less than about 300 nm or less than about 350 nm. Non-limiting ranges of the average diameter of and/or average spacing between the light diffusing elements 144 include between about 100 nm and about 150 nm, between about 150 nm and 200 nm, between about 200 nm and 250 nm, between about 250 nm and 300 nm, and between about 300 nm and 350 nm.

The outer rough surface 142, i.e., the outer oxide surface with the plurality of light diffusing elements 144, is configured to diffuse laser light during LIL of the photoresist 110 such that reflection of the laser beam 120 from the light diffusing layer 140 is below a desired predefined value. In some variations, the outer rough surface 142 reflects less than 10% of incident laser light, and in at least one variation the outer rough surface 142 reflects less than 5% of incident laser light. And in some variations, the outer rough surface 142 reflects less than 2.5% of incident laser light, for example, less than 1% of incident laser light.

Figure 7A:
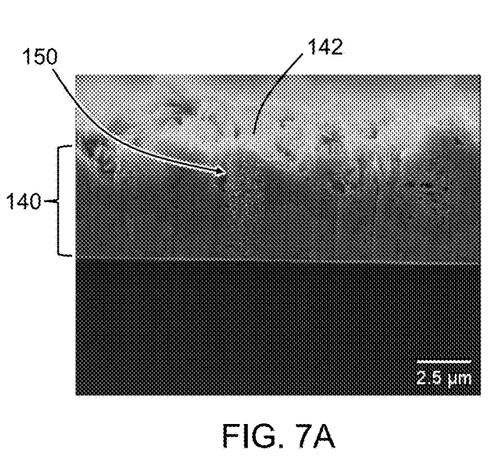
FIG. 7A is an SEM image of a copper light diffusing layer with an outer copper oxide layer according to the teachings of the present disclosure.
Figure 7B:
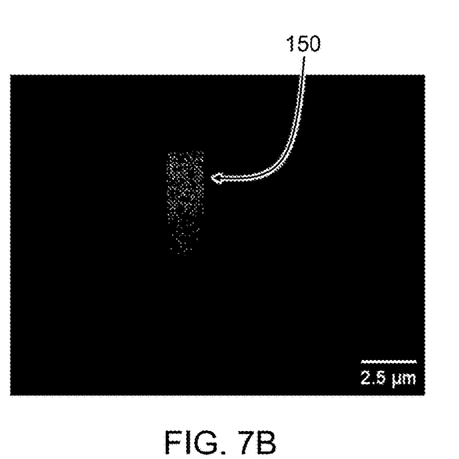
FIG. 7B is an energy dispersive spectrum of the rectangular section in FIG. 7A with a measure of oxygen content shown.

Still referring to FIGS. 6A and 6B, the outer Cu-oxide layer(s) of the light diffusing layer 140 is/are configured to be reduced to the base metal (i.e., Cu) of the Cu-oxide upon electroplating of a metallic layer onto the light diffusing layer 140 (and substrate 100). For example, and with reference to FIGS. 7A-7E, FIG. 7A shows a FIB cross-section of a Cu light diffusing layer 140 with an outer rough surface 142 that includes light diffusing elements 144 in the form of Cu-oxide needles. In addition, the highlighted rectangle region 150 was analyzed via energy dispersive x-ray spectroscopy (EDS) and an energy dispersive spectrum of oxygen in the rectangle region 150 is shown in FIG. 7B. That is, the number and/or intensity of the "dots" shown in the rectangle region 150 provides a measure of oxygen content at this location or region. Also, the number and/or intensity of the dots shown in FIG. 7B illustrate the presence of Cu-oxide at the outer surface of the light diffusing layer 140.

Figure 7C:
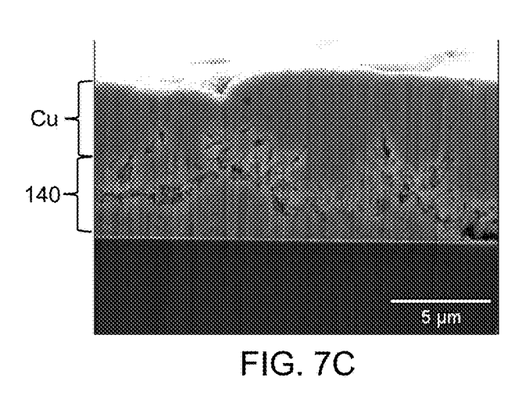
FIG. 7C is an SEM image of the copper light diffusing layer in FIG. 7A after electroplating plating copper onto the outer copper oxide layer according to the teachings of the present disclosure.
Figure 7D:
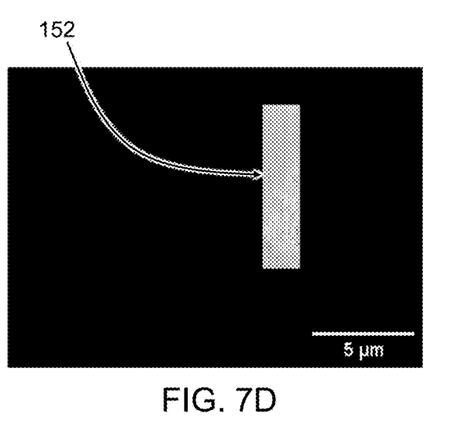
FIG. 7D is an SEM image of a rectangular section of the copper light diffusing layer in FIG. 7C.
Figure 7E:
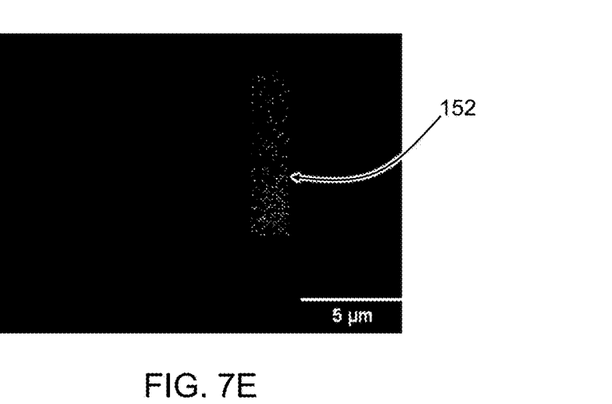
FIG. 7E is an energy dispersive spectrum of the rectangular section in FIG. 7D with a measure of oxygen content shown.

Referring particularly to FIGS. 7C-7E, FIG. 7C shows a FIB cross-section of the Cu light diffusing layer 140 after electroplating of Cu thereon, FIG. 7D shows a highlighted rectangle region 152 that was analyzed via EDS, and FIG. 7E show an energy dispersive spectrum of oxygen in the rectangle region 152. A comparison of the energy dispersive spectrum of oxygen for the rectangle region 152 in FIG. 7E with the energy dispersive spectrum of oxygen for the rectangle region 150 illustrates a significant reduction in oxygen content in the rectangle region 152. Accordingly, the outer Cu-oxide layer(s) have been reduced to Cu and an electrically conductive light diffusing layer 140 is provided according to the teachings of the present disclosure.

While FIGS. 6A-7E show and discuss a Cu light diffusing layer 140, it should be understood that the light diffusing layer 140 can include or be formed from other metallic elements. Non-limiting examples of metallic elements formed from and/or included in the light diffusing layer 140 include copper, zinc, tin, nickel, tungsten, titanium, aluminum, manganese, and combinations thereof, e.g., copper alloys such as brass, nickel alloys, titanium alloys, aluminum alloys, among others. It should be understood that the light diffusing layer 140, and particularly the light diffusing elements 144, can be formed via thermal and/or chemical oxidation of the inner layer 141. That is, a metallic layer such as a layer of copper, brass, bronze and/or titanium can be applied or deposited onto a reflective substrate and subsequently subjected to a via thermal and/or chemical oxidation treatment such that light diffusing elements are grown or formed on an outer surface of the metallic layer and a light diffusing layer with an outer rough surface on the reflective substrate is provided.

And while FIG. 7C illustrates Cu electroplated onto the light diffusing layer 140, it should be understood that other metallic elements can be electroplated onto the light diffusing layer 140. For example, electroplating of metallic elements such as copper, zinc, tin, nickel, tungsten, titanium, aluminum, manganese, among others, and combinations thereof, onto the light diffusing layer 140 is included in the teachings of the present disclosure.

Figure 8:
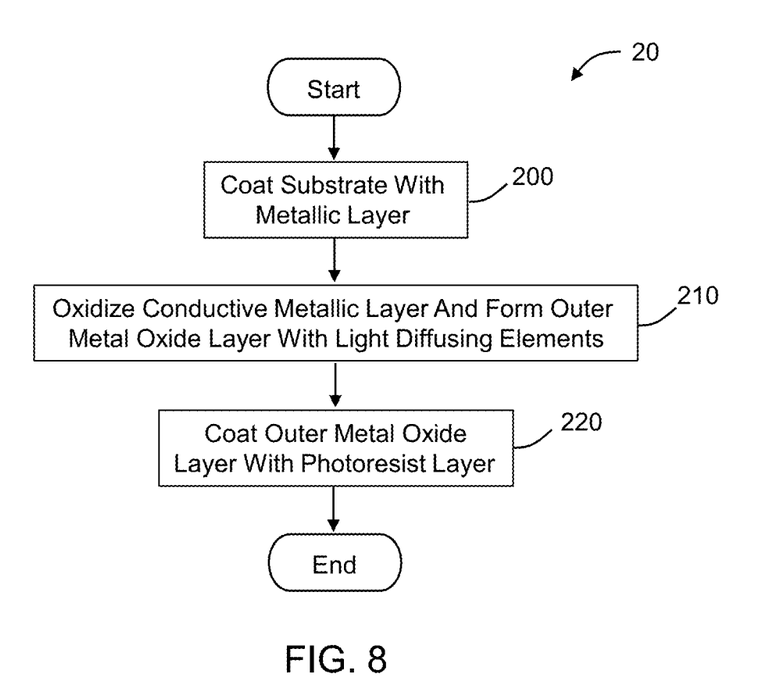
FIG. 8 is a flow chart for a method of forming a component with a photoresist layer on a reflective substrate according to the teachings of the present disclosure.

Referring now to FIG. 8, a flow chart for a method 20 of forming or making a photoresist component for LIL according to the teachings of the present disclosure is shown. The method 20 includes coating a substrate with a metallic layer at 200, oxidizing the metallic layer to form a rough outer surface comprising a metal oxide layer at 210, and coating or forming a photoresist layer on the metal oxide layer at 220. Non-limiting methods or techniques used to coat the substrate (e.g., a reflective substrate) with the metallic layer include electroplating, chemical vapor deposition, and physical vapor deposition, among others. The photoresist component made according to the method 20 is configured to exhibit reduced reflection of laser light from the metal oxide layer during LIL such that a desired void space pattern can be formed in a photoresist layer disposed on a substrate (e.g., see FIG. 5).

Figure 9:
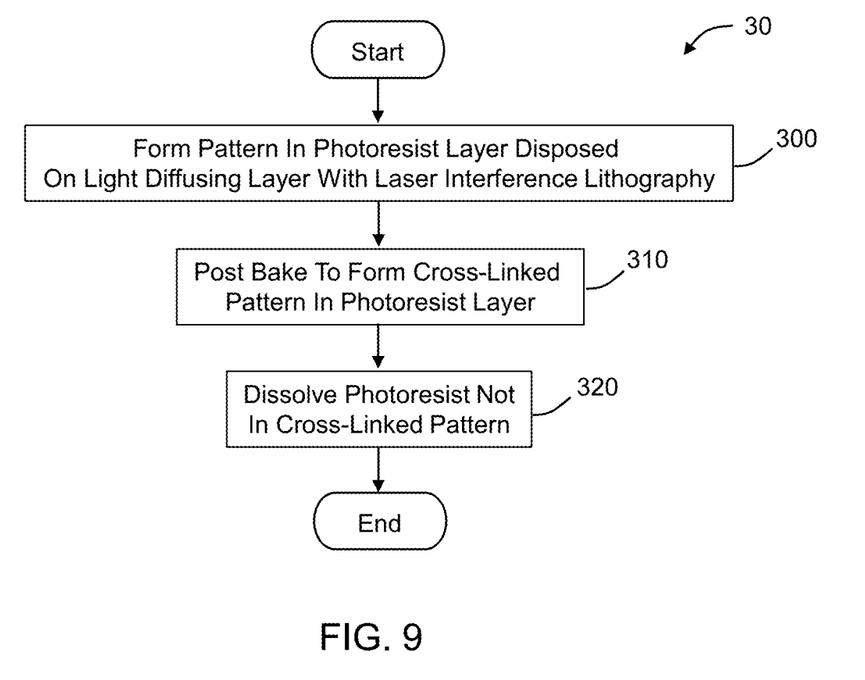
FIG. 9 is a flow chart for a method of forming a void space pattern in a photoresist layer on a reflective substrate according to the teachings of the present disclosure.

Referring to FIG. 9, a flow chart for a method 30 of forming a desired pattern in a photoresist on a substrate is shown. The method 30 includes using LIL to produce a desired exposed pattern in a photoresist disposed on a light diffusing layer according to the teachings of the present disclosure at 300 and post baking the photoresist at 310 to assist in or ensure forming of a cross-linked pattern in the photoresist. The light diffusing layer with an outer rough surface results in reduced or minimal reflection of the laser light within the photoresist such that the cross-linked pattern in the photoresist is not deteriorated as discussed above. The photoresist material not cross-linked is dissolved with a photoresist developer at 250 such that a desired void space pattern in the photoresist is created or formed.

Figure 10:
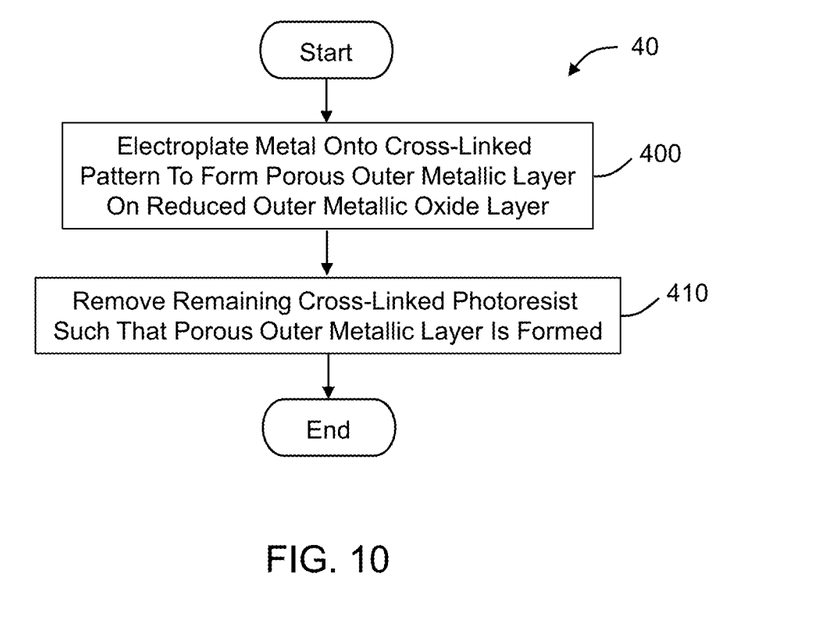
FIG. 10 is a flow chart for a method of forming a porous metallic layer on a reflective substrate according to the teachings of the present disclosure.

Referring to FIG. 10, a flow chart for a method 40 of forming a porous metallic layer onto a reflective substrate is shown. The method 40 includes electroplating a metallic material into a desired void space pattern in a photoresist layer at 400 and onto a light diffusing layer with an outer metal oxide layer disposed on the reflective substrate. The void space pattern is formed via LIL of the photoresist layer (i.e., LIL, post baking and dissolving of photoresist material not cross-linked) and the light diffusing layer reduces or minimizes reflection of laser light during the LIL such that a desired cross-linked pattern in the photoresist is formed, and a desired void space pattern is formed when the photoresist is exposed to photoresist developer. Also, the outer metal oxide layer is reduced to the parent metal of the metal oxide during electroplating of the metallic material such that the light diffusing layer is electrically conductive. The remaining cross-linked photoresist is removed at 410 such that a porous outer metallic layer is left or formed on the reflective substrate.

The preceding description is merely illustrative in nature and is in no way intended to limit the disclosure, its application, or uses. Work of the presently named inventors, to the extent it may be described in the background section, as well as aspects of the description that may not otherwise qualify as prior art at the time of filing, are neither expressly nor impliedly admitted as prior art against the present technology.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple variations or forms having stated features is not intended to exclude other variations or forms having additional features, or other variations or forms incorporating different combinations of the stated features.

As used herein the phrase "sandwiched between" or "disposed between" refers to an element or layer positioned between two additional elements or layers. In some variations, sandwiched between refers to a layer positioned between and in direct contact with two additional layers, while in other variations, sandwiched between refers to a layer positioned between two additional layers with one or more additional layers between the layer and one or both of the two additional layers.

As used herein, "disposed on" refers to an element or layer positioned or located on another element or layer. In some variations, disposed on refers to a layer positioned on and in direct contact with another layer, while in other variations, disposed on refers to a layer positioned on another layer with one or more additional layers between the layer and the additional layer.

As used herein, the term "outer" refers to a surface, layer, or element positioned closer in distance to a free surface of a component than an "inner" surface layer, or element. Also the term "outward" refers to a direction extending from an outer surface of a substrate of a component towards a free surface of the component, e.g., an "outward direction" is a direction from an outer surface of a substrate towards a free surface of a photoresist layer disposed on the outer surface of the substrate.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g. AB, AC, BC or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should be also understood that the various method steps discussed herein do not have to be carried out in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A component comprising:
   a substrate;
   a photoresist layer disposed on the substrate; and
   a light diffusing layer sandwiched between the substrate and the photoresist layer, the light diffusing layer comprising an outer metal oxide layer having an outer rough surface configured to diffuse laser light during laser interference lithography of the photoresist layer and reduce to a conductive metallic layer during electroplating of the substrate.

2. The component according to claim 1, wherein the substrate is a reflective substrate.

3. The component according to claim 2, wherein the substrate is silicon.

4. The component according to claim 1, wherein the photoresist layer comprises a photo acid generator.

5. The component according to claim 1, wherein the outer metal oxide layer comprises a plurality of elongated light diffusing elements extending in an outward direction from the substrate.

6. The component according to claim 5, wherein the outer metal oxide layer comprises at least one of an average diameter of and an average spacing between the plurality of elongated light diffusing elements that is less than a wavelength of a laser beam during laser interference lithography of the photoresist layer.

7. The component according to claim 6, wherein the light diffusing layer comprises a conductive metallic layer disposed between the substrate and the outer metal oxide layer.

8. The component according to claim 7, wherein the conductive metallic layer comprises at least one metallic element selected from the group consisting of copper, zinc, tin, nickel, tungsten, titanium, aluminum, and manganese.

9. The component according to claim 8, wherein the conductive metallic layer comprises a copper layer.

10. The component according to claim 9, wherein the outer metal oxide layer is a copper oxide layer.

11. The component according to claim 10, wherein the copper oxide layer comprises a CuO layer.

12. The component according to claim 11 further comprising a $Cu_2O$ layer disposed between and the CuO layer and the copper layer.

13. The component according to claim 11, wherein the outer rough surface of the CuO layer comprises needles of CuO extending in an outward direction from the substrate.

14. The component according to claim 13, wherein the needles of CuO have an average diameter less than a wavelength of a laser beam during laser interference lithography of the photoresist layer.

15. The component according to claim 11, wherein the outer rough surface of the CuO layer comprises rods of CuO extending in an outward direction from the substrate, the rods of CuO having an average diameter less than a wavelength of a laser during laser interference lithography.

16. A component comprising:
    a substrate comprising silicon;
    a photoresist layer disposed on the substrate; and
    a light diffusing layer sandwiched between the substrate and the photoresist layer, the light diffusing layer comprising an outer copper oxide layer with light diffusing elements extending in an outward direction from the substrate, wherein an average diameter of and an average spacing between the light diffusing elements are less than about 150 nanometers such that the outer copper oxide layer is configured to diffuse laser light during laser interference lithography of the photoresist layer.

17. The component according to claim 16, wherein the light diffusing elements are needles of copper oxide.

18. The component according to claim 16, wherein the light diffusing elements are nanorods of copper oxide.

19. A method comprising:
    coating a reflective substrate with a conductive metallic layer;
    oxidizing the conductive metallic layer and forming an outer metal oxide layer;
    coating the outer metal oxide layer with a photoresist layer; and
    forming a pattern in the photoresist layer using laser interference lithography, wherein the outer metal oxide layer diffuses at least 90% of laser light during the laser interference lithography of the photoresist layer.

20. The method according to claim 19 further comprising forming a porous metallic layer on the reflective substrate via electroplating the pattern in the photoresist layer, wherein the outer metal oxide layer reduces to a metal of the outer metal oxide layer during the electroplating.

* * * * *